(12) United States Patent
Zhang et al.

(10) Patent No.: US 10,199,348 B2
(45) Date of Patent: Feb. 5, 2019

(54) PLASTIC-PACKAGED SEMICONDUCTOR DEVICE HAVING WIRES WITH POLYMERIZED INSULATING LAYER

(71) Applicant: TEXAS INSTRUMENTS INCORPORATED, Dallas, TX (US)

(72) Inventors: Rongwei Zhang, Dallas, TX (US); Abram Castro, Fort Worth, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/194,293

(22) Filed: Jun. 27, 2016

(65) Prior Publication Data

US 2016/0307866 A1    Oct. 20, 2016

Related U.S. Application Data

(60) Continuation of application No. 14/520,406, filed on Oct. 22, 2014, now Pat. No. 9,378,984, which is a
(Continued)

(51) Int. Cl.
*H01L 23/00* (2006.01)
*H01L 21/56* (2006.01)
(Continued)

(52) U.S. Cl.
CPC .......... *H01L 24/48* (2013.01); *B29C 45/0001* (2013.01); *B29C 45/14655* (2013.01); *C08K 3/10* (2013.01); *C08K 3/36* (2013.01); *C08K 7/14* (2013.01); *H01B 3/40* (2013.01); *H01L 21/56* (2013.01); *H01L 21/565* (2013.01); *H01L 23/295* (2013.01); *H01L 23/4952* (2013.01);
(Continued)

(58) Field of Classification Search
CPC ... H01L 2224/48247; H01L 2924/0665; H01L 2224/04042; H01L 23/4952; H01L 24/48
See application file for complete search history.

(56) References Cited

U.S. PATENT DOCUMENTS 2,278,350 A    3/1942 Graves
4,184,001 A *  1/1980 Hildreth ................. H01B 3/445
                                                        174/120 C
(Continued)

*Primary Examiner* — Joseph C Nicely
*Assistant Examiner* — Wilner Jean Baptiste
(74) *Attorney, Agent, or Firm* — Dawn Jos; Charles A. Brill; Frank D. Cimino

(57) ABSTRACT

The assembly of a chip (101) attached to a substrate (103) with wires (201) spanning from the chip to the substrate is loaded in a heated cavity (402) of a mold; the wire surfaces are coated with an adsorbed layer of molecules of a heterocyclic compound (302); a pressure chamber (404) of the mold is loaded with a solid pellet (410) of a packaging material including a polymerizable resin, the chamber being connected to the cavity; the vapor of resin molecules is allowed to spread from the chamber to the assembly inside the cavity during the time interval needed to heat the solid pellet for rendering it semi-liquid and to pressurize it through runners (403) before filling the mold cavity, whereby the resin molecules arriving in the cavity are cross-linked by the adsorbed heterocyclic compound molecules into an electrically insulating at least one monolayer of polymeric structures on the wire surfaces.

16 Claims, 4 Drawing Sheets

Related U.S. Application Data division of application No. 13/787,198, filed on Mar. 6, 2013, now abandoned.

(60) Provisional application No. 61/625,996, filed on Apr. 18, 2012.

(51) Int. Cl.
| | |
|---|---|
| *H01L 23/29* | (2006.01) |
| *B29C 45/14* | (2006.01) |
| *B29C 45/00* | (2006.01) |
| *C08K 3/10* | (2018.01) |
| *C08K 3/36* | (2006.01) |
| *C08K 7/14* | (2006.01) |
| *H01B 3/40* | (2006.01) |
| *H01L 23/495* | (2006.01) |

(52) U.S. Cl.
CPC ............ *H01L 24/43* (2013.01); *H01L 24/85* (2013.01); *B29C 45/0046* (2013.01); *B29C 45/14836* (2013.01); *H01L 24/05* (2013.01); *H01L 24/29* (2013.01); *H01L 24/32* (2013.01); *H01L 24/45* (2013.01); *H01L 2224/04042* (2013.01); *H01L 2224/05624* (2013.01); *H01L 2224/05647* (2013.01); *H01L 2224/2919* (2013.01); *H01L 2224/32225* (2013.01); *H01L 2224/32245* (2013.01); *H01L 2224/4382* (2013.01); *H01L 2224/43848* (2013.01); *H01L 2224/45014* (2013.01); *H01L 2224/45015* (2013.01); *H01L 2224/45124* (2013.01); *H01L 2224/45144* (2013.01); *H01L 2224/45147* (2013.01); *H01L 2224/485* (2013.01); *H01L 2224/48091* (2013.01); *H01L 2224/48221* (2013.01); *H01L 2224/48227* (2013.01); *H01L 2224/48247* (2013.01); *H01L 2224/48463* (2013.01); *H01L 2224/48465* (2013.01); *H01L 2224/48624* (2013.01); *H01L 2224/48647* (2013.01); *H01L 2224/48724* (2013.01); *H01L 2224/48747* (2013.01); *H01L 2224/48824* (2013.01); *H01L 2224/48847* (2013.01); *H01L 2224/73265* (2013.01); *H01L 2224/8592* (2013.01); *H01L 2224/92247* (2013.01); *H01L 2924/0665* (2013.01); *H01L 2924/1032* (2013.01); *H01L 2924/10253* (2013.01); *H01L 2924/10271* (2013.01); *H01L 2924/10329* (2013.01); *H01L 2924/181* (2013.01); *H01L 2924/3862* (2013.01)

(56) References Cited

U.S. PATENT DOCUMENTS

| | | |
|---|---|---|
| 5,800,747 A | 9/1998 | Cavasin |
| 6,822,340 B2 | 11/2004 | Lamson et al. |
| 7,968,463 B2 | 6/2011 | Nakagawa et al. |
| 2007/0090539 A1* | 4/2007 | Hosseini ............ H01L 23/3121 257/784 |
| 2009/0091029 A1 | 4/2009 | Ano et al. |
| 2010/0084757 A1 | 4/2010 | Hariharan et al. |
| 2010/0096734 A1* | 4/2010 | Abbott ................ H01L 21/568 257/666 |
| 2010/0187678 A1* | 7/2010 | Kajiwara ................ H01L 21/56 257/692 |
| 2011/0024890 A1* | 2/2011 | Yang .................... H01L 21/486 257/686 |
| 2011/0089549 A1 | 4/2011 | Zenbutsu et al. |

\* cited by examiner

PLASTIC-PACKAGED SEMICONDUCTOR DEVICE HAVING WIRES WITH POLYMERIZED INSULATING LAYER

This application is a continuation of patent application Ser. No. 14/520,406, filed Oct. 22, 2014 (now U.S. Pat. No. 9,378,984), which is a divisional of patent application Ser. No. 13/787,198, filed Mar. 6, 2013, which claims the benefit of Provisional Patent Application No. 61/625,996, filed Apr. 18, 2012, the contents of all of which are herein incorporated by reference in its entirety.

FIELD OF THE INVENTION

The present invention is related in general to the field of semiconductor devices and processes, and more specifically to plastic-packaged semiconductor devices with bonding wires having wire short protection by a polymerized insulator skin around the wires, and methods to fabricate these protections.

DESCRIPTION OF RELATED ART

The ongoing trend towards miniaturization, high performance and cost reduction of plastic packaged semiconductor devices drives ever higher density of the wire bonds employed for these packages. The required wire density, in turn, drives not only a reduction of the pitches of the bond pads, for instance from 70 μm to 35 μm and smaller, and of the wire spans, but also a reduction of the wire diameter, for instance from 30 μm to 20 μm and smaller. The reduced wire diameter decreases the stiffness of the bonded wire and thus the robustness of the wire span, even for specially alloyed or heat treated wires. For example, it has been found that the stiffness of 20 μm and 15 μm diameter wires is 41% and 13%, respectively, of a 25 μm diameter wire.

As a consequence, a major factor limiting the density of bonded wires is wire sweep during the molding processes for creating the plastic encapsulation. Wire sweep not only distorts the configurations and orderly sequence of wire spans, but it may result in mutual touching of adjacent wires, which causes electrical shorts and device malfunctioning. To improve or avoid wire sweep and subsequent risk of short, design rules for wire length, wire diameter and bond pad pitch of semiconductor devices often have to be constrained. Furthermore, the propensity for wire sweep/short of the commonly used epoxy-based molding compound formulations has been extensively investigated for effects of resin type, filler content, shape and size, hardener viscosity, and catalyst level; in addition, designs of mold equipment and detail of the molding process have been investigated. As an example, while the use of smaller filler particles may increase compound viscosity and thus wire sweep, the viscosity can be reduced by lower resin viscosity and slower transfer molding speed.

Another method for reducing wire sweep proposes the use of wires in insulating tubes or pipes; this approach, however, was found to cause difficulties in forming free air balls, ball bonds, and stitch bonds, and in contaminating capillaries.

In still another approach, a silica-filled liquid polymer is dispensed smoothly to encapsulate wires after bonding; then, an ultraviolet radiation cure is used to jell the liquid for handling and later molding. The silica-filled liquid polymer can be fully cured along with the molding compound during post-mold curing. It turned out that this approach of direct coating with an insulating polymeric compound may cause mismatch of the coefficients of thermal expansion between dispensed polymers and molding compounds with the conventional >85 weight % inorganic fillers.

SUMMARY OF THE INVENTION

Applicants recognized the need for plastic semiconductor devices to have protection in place against electrical shorts by wire sweep before the wires have a chance to actually contact each other by some unexpected sweep during the encapsulation process; with such protection in place, any deleterious electrical consequences by an accidental wire contact would be nullified. Applicants realized that the protection should be accomplished without undesirable repercussions on design rules for bond pads, wire pitch or device scaling, or without any side effects on process reliability or wire bond reliability; in addition, any increase of process cost should be minimized or preferably avoided. At present, these boundary conditions exclude the proposals for wire sweep protection discussed in literature.

Applicants solved the problem of electrical shorts by wire sweep when they discovered that an insulating skin around each wire can be created without cost increase and undesirable assembly changes by a process step during wire bonding which coats the wire surfaces with an adsorbed layer of a chemical catalyst. The catalyst acts then to stimulate the polymerization of molding resin molecules arriving at the wire surface. Preferred catalysts were identified as a heterocyclic compound such as imidazole; the molding resin may be any polymer of the epoxy and related families.

In an exemplary process flow, the chip-on-leadframe assembly is positioned n the cavity of the mold equipment before the encapsulation process is initiated. The preheated uncured molding compound is placed in the transfer pot of the mold. In the heating phase, the mold compound pellets, which contain epoxy resins, produce vapor of resin molecules; the heating phase extends through the time interval needed to heat the solid pellet for rendering it semi-liquid and pressing it through the mold runners to fill the mold cavity. The vapor of resin molecules diffuses quickly through the mold runner into the mold cavity. When the resin molecules arrive at the wire surfaces covered with the heterocyclic compound molecules, the catalytic heterocyclic molecules polymerize the resin molecules at the wire surfaces to at least one polymeric monolayer covering the wire surface. It has been demonstrated that the at least one monolayer of polymerized epoxy can provide effective electrical insulation for preventing a short.

It is a technical advantage of the invention that the method for forming the insulating skin covering the wires and preventing an electrical short does not require additional time, equipment or expenditure compared to conventional wire bonding and encapsulation processes.

It is another technical advantage that the method of the invention can be implemented in any packaging process flow of any semiconductor device using wire bonding and plastic encapsulation.

BRIEF DESCRIPTION OF THE DRAWINGS

FIG. 1 shows the step of attaching a semiconductor chip onto a substrate.

FIG. 2 illustrates the step of spanning bonding wires from the chip to the substrate.

FIG. 3 depicts the step of coating the wire surfaces with a layer of a heterocyclic compound.

FIG. 4 illustrates the interaction of vapor-borne resin molecules from heated resin pellets in a mold chamber with molecules of the heterocyclic compound adsorbed on the bonding wires of the assembled semiconductor chip positioned in a mold cavity.

FIG. 5 shows the assembled chip encapsulated by a polymerized compound including grains of filler, wherein the polymeric region contiguous with the wire surfaces includes heterocyclic molecules and is free of filler grains.

FIG. 6A is a formulaic representation of imidazole.
FIG. 6B is a formulaic representation of pyrrole.
FIG. 6C is a formulaic representation of pyrazole.
FIG. 6D is a formulaic representation of pyrazoline.
FIG. 6E is a formulaic representation of pyrazolone.

DETAILED DESCRIPTION OF THE PREFERRED EMBODIMENTS

Figure 1:
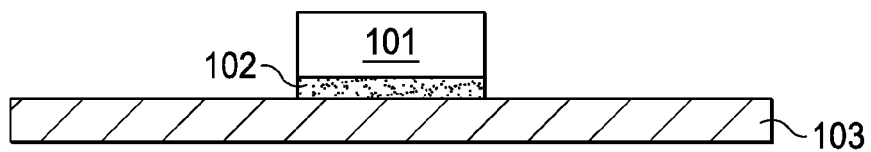
FIGS. 1 to 5 depict certain process steps of the fabrication method according to the invention.

An embodiment of the invention is a method for fabricating a plastic encapsulated semiconductor device with bonding wires, which are protected against electrical shorting if they should touch due to wire sweep during the encapsulation process. FIGS. 1 to 5 illustrate certain steps of the fabrication method using an exemplary device for demonstration. In FIG. 1, a semiconductor chip 101 is attached with an adhesive layer 102 to a substrate 103. Chip 101 has a plurality of bondable terminal pads. Chip 101 may be made of silicon, silicon germanium, gallium arsenide, III-V compounds, or any other material used in electronic technology. The terminal pads may be metal such as aluminum or copper, or any other material onto which conductive connectors can be affixed. Substrate 103 may be a metal leadframe or a multimetal-level substrate, laminated substrate, or any other suitable support structure.

Figure 2:
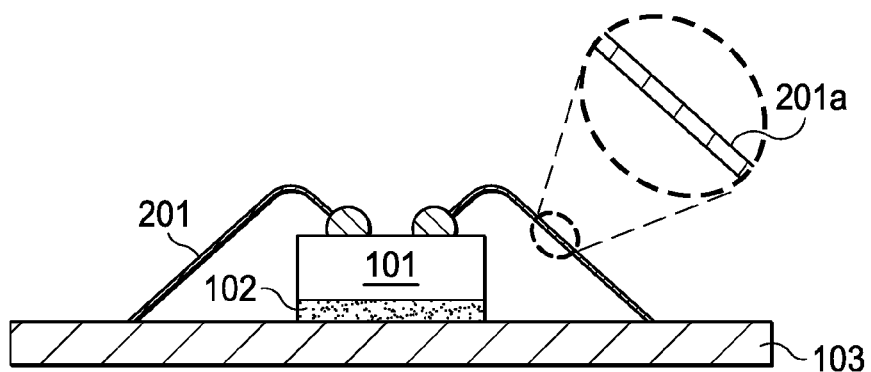

FIG. 2 depicts the process step of attaching bonding wires 201 to the chip terminals and spanning the bonding wires from the chip to respective substrate pads, preferably using some sort of arc. In the example of FIG. 2, ball bonding is used; alternatively double-stitch bonding or ribbon bonding may be employed. The conventionally preferred gold wires are recently more and more replaced by wires made of lower cost metals such as copper or aluminum. The enlargement of wire 201 shows a wire portion 201a with bare surfaces. The common trend for all device types and all wire metals is to miniaturize the distance between adjacent wire arcs by selecting a finer pitch center-to-center of the chip bond pads (for instance from 70 μm to 35 μm) and reducing the diameter of the wires (for instance from 30 μm to 20 μm). The miniaturization trend continues in spite of the fact the stiffness of the bonded wires and thus the robustness of the wire spans are decreased, even for specially alloyed or heat treated wires. For example, the stiffness of 20 μm and 15 μm diameter wires is 41% and 13%, respectively, of a 25 μm diameter wire.

Figure 6A:
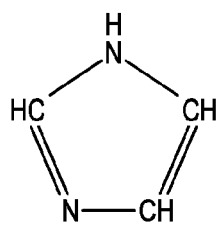
FIGS. 6A to 6E illustrate examples of heterocyclic compounds suitable as catalysts for polymerizing epoxy resins.
Figure 3:
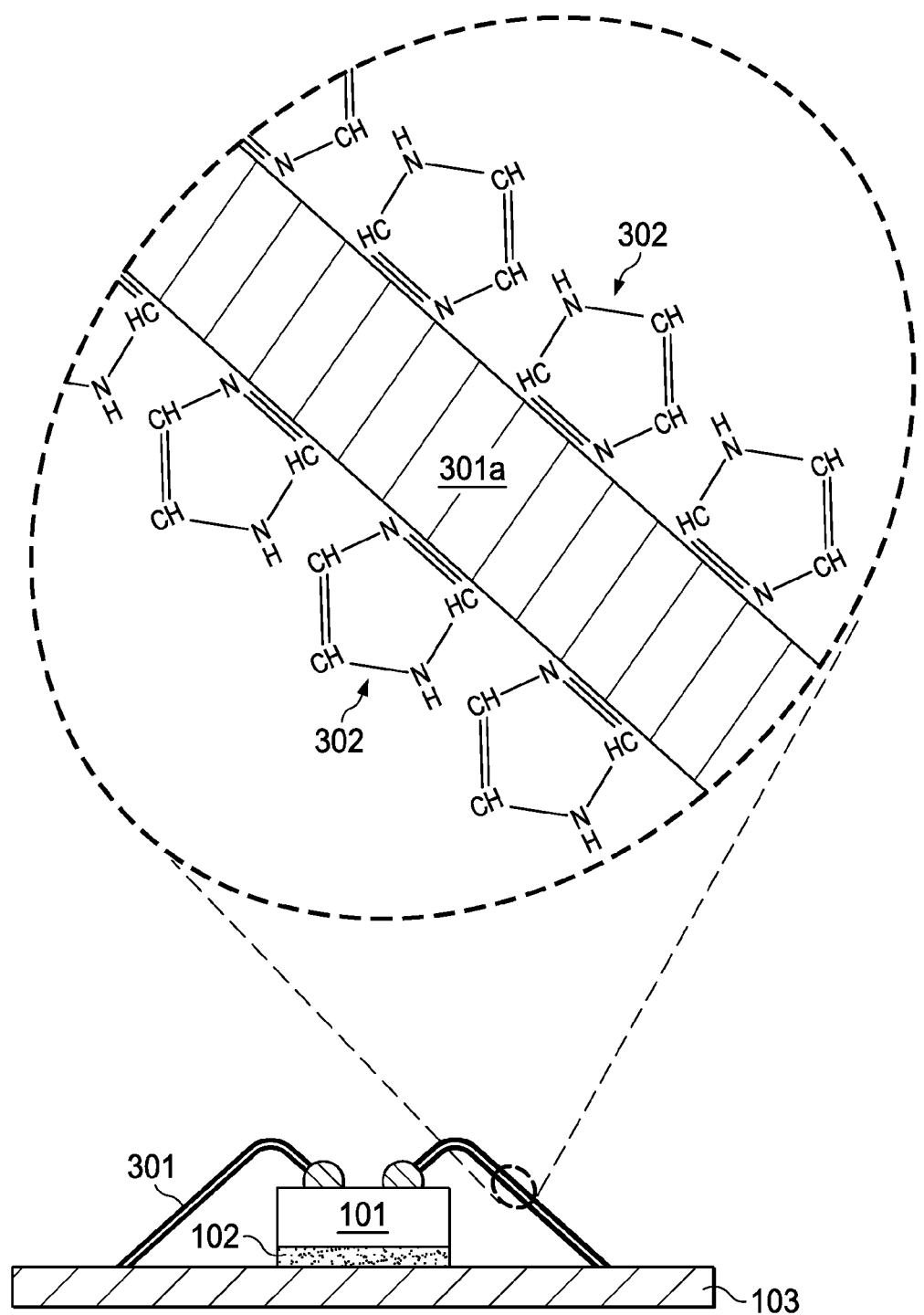

In the next process step displayed in FIG. 3, the surfaces of the wire spans are coated with a layer of a heterocyclic compound; the coated wires are designated 301. After completing the wire-bonding operation proper, automated bonders (for example available from the company Kulicke & Soffa, Fort Washington, Pa.) offer on-bonder dispense systems, which allow the dispensing of liquids over the just-completed wire spans. An exemplary liquid consists of a solution of about 1 millimole per liter (mmol/L) of a heterocyclic compound in ethanol. In the dispensing step, a layer of liquid is formed on the wire surfaces. The ethanol will be evaporated after dispensing, while at least one monolayer 302 of the heterocyclic compound remains adsorbed on the wire surfaces. The adsorbed layer 302 is shown in the insert of FIG. 3 by the enlargement of a wire portion 301a. The preferred heterocyclic compound is imidazole (see FIG. 6A); after being adsorbed on the surfaces of wire 301, imidazole can act as catalyst for polymerizing epoxy-type long-chain molecules.

Figure 6B:
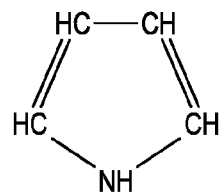
Figure 6C:
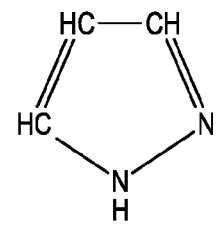
Figure 6D:
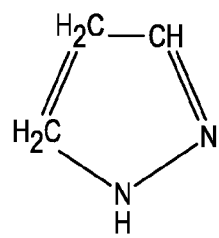
Figure 6E:
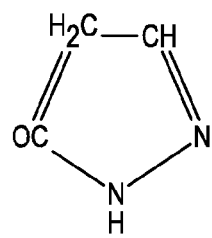

By way of explanation, a heterocyclic compound has a five-membered ring, which includes besides carbon atoms other atoms such as nitrogen, oxygen, or sulfur. The heterocyclic compounds preferred for this invention have at least one nitrogen atom. The basic compound is pyrrole ($C_4H_5N_1$, see FIG. 6B) with a five-membered di-unsaturated ring and one nitrogen atom. Pyrazole ($C_3H_4N_2$, see FIG. 6C) has two adjacent nitrogen atoms as part of the ring. Isomeric with pyrazole is imidazole ($C_3H_4N_2$, see FIG. 6A), which has two non-adjacent nitrogen atoms as part of the ring. As catalyst, imidazole is the preferred compound for the present invention. The heterocyclic compound, which is richer by two hydrogen atoms, is called pyrazoline (see FIG. 6D), and its ketone is called pyrazolone (see FIG. 6E).

Alternatives to the preferred imidazole are triazole ($C_2H_3N_3$), containing a five-membered ring with three nitrogen atoms as part of the ring; further pentazole, thiazole, isothiazole, and their derivatives.

Figure 4:
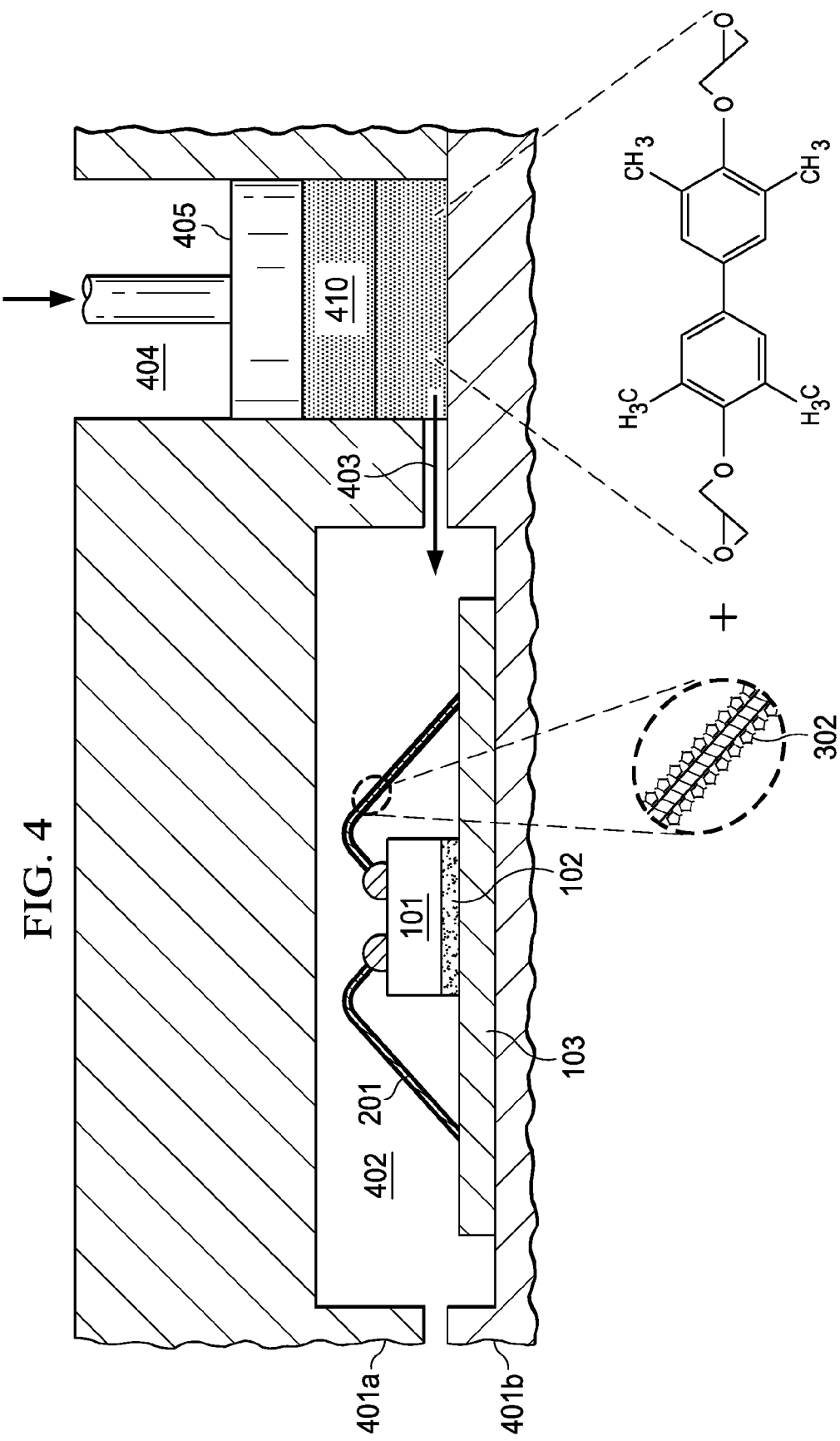

The next process steps are summarized in FIG. 4. After assembly, the substrate together with the attached and wire-bonded chip, with the layers of heterocyclic compound adsorbed on the wire surfaces, is loaded into the cavity 402 of a steel mold suitable for the transfer molding process flow. The mold consists of a top half 401a and a bottom half 401b; both halves of the mold are preheated to a temperature between ambient temperature and the liquefying temperature of pellet. After placing the assembly on the bottom half 401b of the cavity, the top mold half 401a is closed, whereby the preheated cavity 401 is connected by a preheated runner 403 with the preheated pressure chamber 404.

Solid pellets 410 of the packaging material are then loaded into the preheated pressure chamber 404; the number of pellets may vary according to the number of cavities to be filled by the transfer step. The top pellet is weighed down by movable plunger 405, which can be activated to pressure the packaging material into the cavity after liquefying the pellets.

In the preferred packaging material for transfer-molded devices, each pellet is composed of an epoxy-type resin or another suitable thermoset compound and about 80 to 90 weight % inorganic filler grains such as crystalline and fused silica. In addition, molding compounds may also include coupling agents, hardeners, flame retardants, mold release agents, and curing agents to convert the resin into a cross linked (polymerized) structure; preferred curing agents are tertiary amines; polyfunctional amines; and acid anhydrides. Polymerizable epoxy resins include biphenyl-type epoxy with epoxide groups at both ends of the resin molecule for cross linking, epoxidized cresol novolac, dicyclopentadiene-type novolac epoxy, and multi-functional type epoxy. Epoxy resins are characterized by the presence of a three-membered cyclic ether group called the oxirane or epoxide ring. Epoxies are defined as cross-linked polymers in which the cross linking is derived from reactions of the epoxide group.

The inorganic fillers include silica (silicon dioxide), alumina trihydrate, glass fibers and many other materials. Filler particle diameters may be less than 1 μm up to several tens micrometers. They are added to the organic resin for increasing mechanical strength and thermal conductivity, and decreasing the coefficient of thermal expansion. Fillers have to be electrically insulating. Since many fillers have high hardness, efforts have been extended to reduce rough contours of filler particles so that they are more or less spherical.

The perheating time for conventional molds is about 40 s. After solid pellets 410 have been loaded into pressure chamber 404, the temperature of the chamber is increased to reach the temperature of low viscosity (liquefying) of the resin, preferably 175° C. The time interval needed to raise the temperature of the solid pellets 410 to the liquefying temperature is preferably between about 5 s and 6 s, dependent on the mold employed; in automolds, the time is between about 2 s and 3 s. The transfer to cavity 402 of the liquefied resin takes about 18 s to 30 s in conventional molds, dependent on the transfer speed, and about 8 s to 10 s in automolds (at 3 mm/s transfer speed). During the time interval (melting time plus transfer time), the vapor of the resin molecules can spread during melting time and be pushed during transfer time from chamber 410 through runner 403 to cavity 402, where the vapor distributes throughout the cavity, reaching the semiconductor assembly inside the cavity, where the assembly includes the bonding wires with the surfaces covered by the adsorbed heterocyclic compound molecules.

When the resin molecules arrive in cavity 402 and reach the wires with the surfaces covered by the adsorbed heterocyclic compound molecules, the resin molecules are cross-linked into at least a monolayer of polymeric structure on the wire surfaces, whereby the adsorbed heterocyclic compound molecules act as catalysts. For most molds, the time interval and the polymerization speed are sufficient to form a layer of polymerized molecules on the wire surfaces with an effective thickness of several monolayers. Experience, however, has shown that a layer of just one monolayer thickness is sufficient to prevent electrical short in cases where wire sweep forces adjacent wires to touch. The insulating characteristic of the polymerized layer is enhanced by the insulating quality of the surface coating with catalyst heterocyclic molecules.

When the semi-viscous resin arrives under pressure in cavity 402, the wires are already surrounded by an insulting skin so that an electrical short by touching wires due to an unintended wire sweep is inhibited. The polymeric resin progresses controlled in a steady wave front until cavity 402 is completely filled with resin. Preferably the polymeric resin is mixed with a curing agent (accelerator) selected from a group including amines, acid anhydrates, and phenol novalac resins. Supported by the curing agent, the resin is allowed to partially polymerize in the cavity while the temperature of the mold is lowered so that the cavity can be opened by lifting the top mold half 401a. After allowing the temperature to cool further, the encapsulated assembly can be removed from the cavity.

Figure 5:
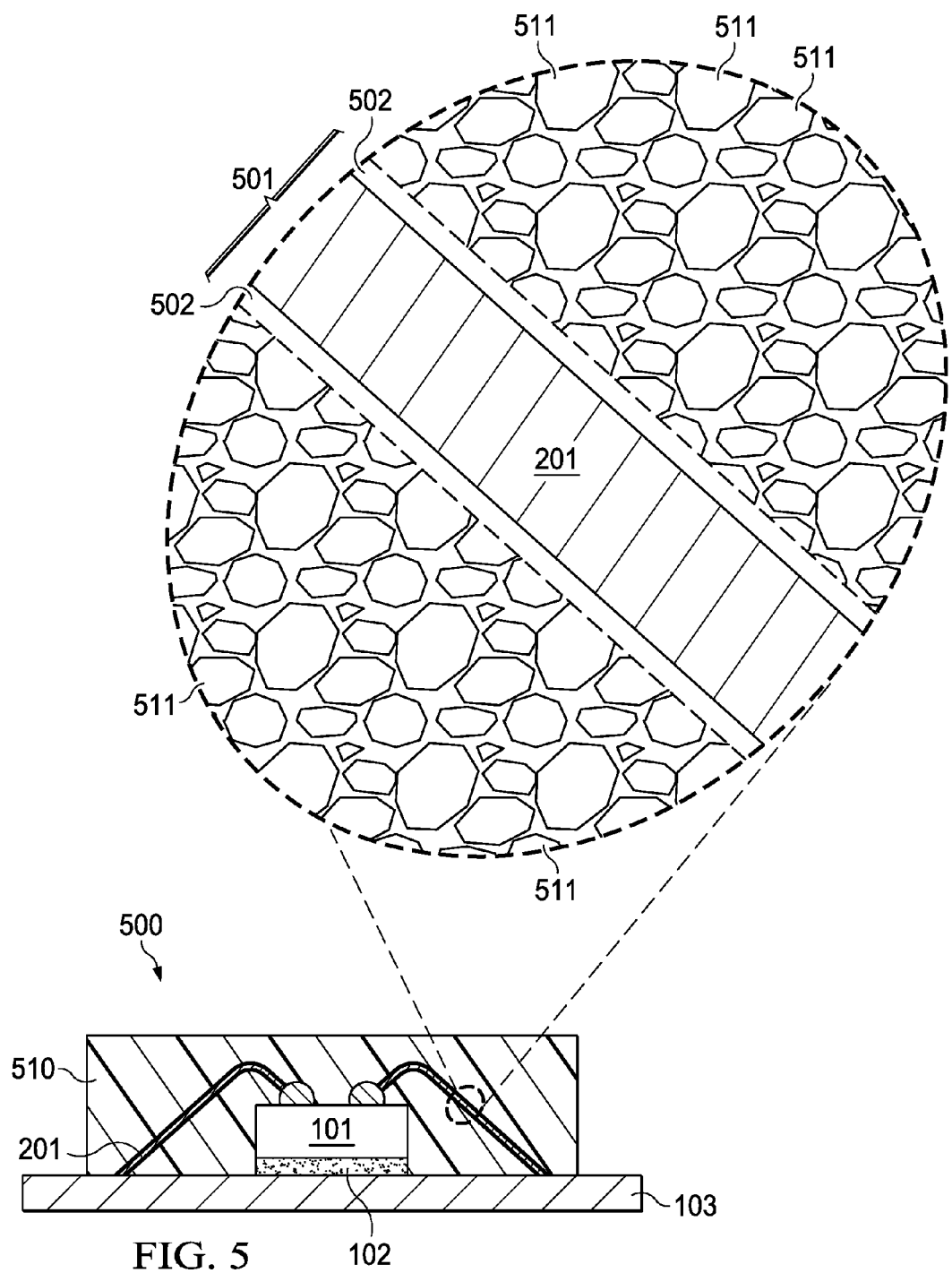

FIG. 5 illustrates an exemplary finished plastic-packaged semiconductor device as an embodiment of the invention; the device is generally designated 500. Exemplary device 500 comprises a semiconductor chip 101 assembled on a substrate 103. Device 101 is connected to substrate 103 by spans of wire 201. Chip 101 and wire spans 102 are encapsulated in a compound 510 including a polymerized resin mixed with inorganic fillers; exemplary filler particles are designated 511 in the enlargement of FIG. 5.

FIG. 5 includes an enlargement of a portion of wire 201. In the enlargement, wire 201 together with a layer of insulating material contiguous with the wire surface is designated 501, the layer itself is designated 502. Insulating layer 502 includes polymerized resin formed from the molecules of the vapor from resin pellets 410, as well as heterocyclic compound adsorbed on the wire surface. As FIG. 5 indicates, insulating layer 502 is free of filler particles 511, since the insulating layer was formed before the semi-viscous resin with the fillers arrived in cavity 402.

The exemplary embodiment of FIGS. 1 to 5 shows a single wire bonded semiconductor chip. Other embodiments may include a plurality of chips. Still other embodiments may include wire-bonded as well as flip-assembled chips. In all cases, an insulating surface skin can be generated on surfaces at risk of electrical shorts from air-borne polymerizable molecules with support from catalysts adsorbed on the surfaces-to-be-protected.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. As an example, the invention applies to products using any type of wire-bonded semiconductor chip, discrete or integrated circuit, and the material of the semiconductor chip may comprise silicon, silicon germanium, gallium arsenide, or any other semiconductor or compound material used in integrated circuit manufacturing.

As another example, the invention applies to systems including a plurality of electronic components with closely pitched bonding wires, which are at risk of being electrically shorted by a medium exerting pressure against the wires. In yet another example, the invention applies to any system with closely pitched parts, which are sensitive to pressure and thus at risk of being electrically shorted, at least temporarily.

It is therefore intended that the appended claims encompass any such modifications or embodiment.

We claim:
1. A semiconductor device comprising:
a semiconductor chip assembled on a substrate and connected to the substrate by wire spans;
the chip and wire spans encapsulated in a compound including a polymerized resin and inorganic fillers; and
the surface of the wire spans covered by an insulating layer including the polymerized resin and a heterocyclic compound, wherein the insulating layer is between the surface of the wire spans and the compound.

2. The device of claim 1 wherein the heterocyclic compound is selected from a group including pyrrole ($C_4H_5N_1$), pyrazole and imidazole ($C_3H_4N_2$), containing a five-membered di-unsaturated ring with two non-adjacent nitrogen atoms as part of the ring; triazole ($C_2H_3N_3$), containing a five-membered ring with three nitrogen atoms as part of the ring; pentazolde, thiazole, isothiazole, and their derivatives.

3. The device of claim 1 wherein the polymerized resin is an epoxy resin selected from a group including bisphenol A and novalac.

4. The device of claim 1 wherein the compound further includes a curing agent selected from a group including amines, acid anhydrates, and phenol novalac resins.

5. The device of claim 4 wherein the inorganic fillers include grains of silicon dioxide, silicon nitride, and aluminum oxide.

6. The device of claim 1 wherein the substrate is a metal leadframe.

7. The device of claim 1, wherein the heterocyclic compound is selected from a group consisting of pyrrole ($C_4H_5N_1$), pyrazole and imidazole ($C_3H_4N_2$), and a five-membered di-unsaturated ring with two non-adjacent nitrogen atoms as part of the ring.

8. A semiconductor device comprising:
- a semiconductor chip electrically connected to a substrate via a wire;
- an insulating layer including a polymerized resin and a heterocyclic compound covering portions of a surface of the wire; and
- a compound including the polymerized resin and inorganic fillers, the compound covering portions of the substrate, the semiconductor chip and the insulating layer, wherein the insulating layer is between the surface of the wire and the compound.

9. The device of claim 8, wherein the wire includes one of copper and aluminum.

10. The device of claim 8, wherein the heterocyclic compound is selected from a group including pyrrole ($C_4H_5N_1$), pyrazole and imidazole ($C_3H_4N_2$), and a five-membered di-unsaturated ring with two non-adjacent nitrogen atoms as part of the ring.

11. The device of claim 8, wherein the inorganic fillers include grains of silicon dioxide, silicon nitride, and aluminum oxide.

12. A semiconductor device comprising:
- a semiconductor chip electrically connected to a substrate via a wire;
- an insulating layer including a monolayer of polymeric structure, the insulating layer covering portions of a surface of the wire; and
- a compound including a polymerized resin and inorganic fillers, the compound covering portions of the substrate, the semiconductor chip and the insulating layer, wherein the insulating layer is between the surface of the wire and the compound.

13. The device of claim 12, wherein the monolayer of polymeric structure is formed in response to cross linking of molecules from a polymerizable resin and a heterocyclic compound.

14. The device of claim 12, wherein the substrate is a lead frame including an attach pad that is attached to the semiconductor chip and at least one lead, the at least one lead connected to one end of the wire.

15. The device of claim 12, wherein the wire includes one of copper and aluminum.

16. The device of claim 12, wherein the heterocyclic compound is selected from a group consisting of pyrrole ($C_4H_5N_1$), pyrazole and imidazole ($C_3H_4N_2$), and a five-membered di-unsaturated ring with two non-adjacent nitrogen atoms as part of the ring.

* * * * *